US011120998B2

(12) United States Patent
Lee et al.

(10) Patent No.: US 11,120,998 B2
(45) Date of Patent: Sep. 14, 2021

(54) ETCHING METHOD AND METHODS OF MANUFACTURING SEMICONDUCTOR DEVICE USING THE SAME

(71) Applicant: Samsung Electronics Co., Ltd., Suwon-si (KR)

(72) Inventors: Sang-Hyun Lee, Hwaseong-si (KR); Jeon-Il Lee, Suwon-si (KR); Sung-Woo Kang, Suwon-si (KR); Hong-Sik Shin, Seoul (KR); Young-Mook Oh, Hwaseong-si (KR); Seung-Min Lee, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 109 days.

(21) Appl. No.: 16/127,443

(22) Filed: Sep. 11, 2018

(65) Prior Publication Data
US 2019/0164774 A1    May 30, 2019

(30) Foreign Application Priority Data
Nov. 28, 2017   (KR) .................. 10-2017-0161019

(51) Int. Cl.
*H01L 21/00*    (2006.01)
*H01L 21/311*    (2006.01)
(Continued)

(52) U.S. Cl.
CPC .... *H01L 21/31116* (2013.01); *H01L 21/0217* (2013.01); *H01L 21/02164* (2013.01);
(Continued)

(58) Field of Classification Search
CPC .......... H01L 21/31116; H01L 21/02164; H01L 21/0217; H01L 21/0332; H01L 21/31144;
(Continued)

(56) References Cited

U.S. PATENT DOCUMENTS 6,492,272 B1 * 12/2002 Okada ................... G03F 7/427
                                                                134/1.2
6,506,674 B2    1/2003 Ikeda et al.
(Continued)

FOREIGN PATENT DOCUMENTS

JP       2009-267432 A    11/2009
JP       2011-187593 A     9/2011

*Primary Examiner* — Mounir S Amer
*Assistant Examiner* — Alexander Belousov
(74) *Attorney, Agent, or Firm* — Lee IP Law, PC

(57) ABSTRACT

An etching method includes providing a plasma of a first treatment gas to an etching-object to form a deposition layer on the etching-object, the first treatment gas including a fluorocarbon gas and an inert gas, and the etching-object including a first region including silicon oxide and a second region including silicon nitride, providing a plasma of an inert gas to the etching-object having the deposition layer thereon to activate an etching reaction of the silicon oxide, wherein a negative direct current voltage is applied to an opposing part that is spaced apart from the etching-object so as to face an etching surface of the etching-object, the opposing part including silicon, and subsequently, providing a plasma of a second treatment gas to remove an etching reaction product, the second treatment gas including an inert gas and an oxygen-containing gas.

7 Claims, 25 Drawing Sheets

(51) Int. Cl.
    *H01L 21/768*      (2006.01)
    *H01L 21/033*      (2006.01)
    *H01L 21/02*      (2006.01)
    *H01L 21/8234*      (2006.01)
    *H01L 29/49*      (2006.01)
    *H01L 29/66*      (2006.01)
    *H01L 21/3213*      (2006.01)
    *H01L 21/3105*      (2006.01)
    *H01L 29/51*      (2006.01)

(52) U.S. Cl.
    CPC .... *H01L 21/0332* (2013.01); *H01L 21/31144* (2013.01); *H01L 21/76802* (2013.01); *H01L 21/76897* (2013.01); *H01L 21/823475* (2013.01); *H01L 21/0262* (2013.01); *H01L 21/02236* (2013.01); *H01L 21/02255* (2013.01); *H01L 21/02529* (2013.01); *H01L 21/02532* (2013.01); *H01L 21/02636* (2013.01); *H01L 21/31053* (2013.01); *H01L 21/32139* (2013.01); *H01L 21/823418* (2013.01); *H01L 21/823425* (2013.01); *H01L 21/823431* (2013.01); *H01L 21/823437* (2013.01); *H01L 21/823481* (2013.01); *H01L 29/4966* (2013.01); *H01L 29/517* (2013.01); *H01L 29/66545* (2013.01); *H01L 29/66636* (2013.01); *H01L 29/66795* (2013.01)

(58) Field of Classification Search
    CPC ......... H01L 21/76802; H01L 21/76897; H01L 21/823475
    See application file for complete search history.

(56) References Cited

U.S. PATENT DOCUMENTS

| | | | |
|---|---|---|---|
| 7,737,023 B2 | 6/2010 | Uno et al. | |
| 8,614,151 B2 | 12/2013 | Benson et al. | |
| 8,664,117 B2 | 3/2014 | Ono et al. | |
| 9,039,909 B2 | 5/2015 | Nakagawa et al. | |
| 9,595,451 B1 | 3/2017 | Zhou et al. | |
| 2003/0034244 A1* | 2/2003 | Yasar | C23C 14/046 204/192.3 |
| 2006/0003545 A1* | 1/2006 | Veerasamy | C23C 14/0664 438/428 |
| 2017/0140923 A1* | 5/2017 | Watanabe | H01L 21/0276 |
| 2017/0207135 A1 | 7/2017 | Lee et al. | |
| 2018/0358163 A1* | 12/2018 | Wang | H01F 41/046 |
| 2019/0198337 A1* | 6/2019 | Shigetoshi | H01L 21/3065 |

* cited by examiner

FIRST DIRECTION
⊗⎯⎯ SECOND DIRECTION

FIRST DIRECTION
⊗ ⟶ SECOND DIRECTION

FIRST DIRECTION
⊗⎯⎯ SECOND DIRECTION

SECOND DIRECTION
⊗ ⟶ FIRST DIRECTION

US 11,120,998 B2

ETCHING METHOD AND METHODS OF MANUFACTURING SEMICONDUCTOR DEVICE USING THE SAME

CROSS-REFERENCE TO RELATED APPLICATION

Korean Patent Application No. 10-2017-0161019, filed on Nov. 28, 2017 in the Korean Intellectual Property Office (KIPO), and entitled: "Etching Method and Methods of Manufacturing Semiconductor Device Using the Same," is incorporated by reference herein in its entirety.

BACKGROUND

1. Field

Embodiments relate to an etching method and methods of manufacturing a semiconductor device using the same.

2. Description of the Related Art

An etching method may be performed in the course of manufacturing a semiconductor device. The object being etched may include a variety of structures and/or a variety of materials. Etching may selectively remove one material relative to another material, such that the etching provides an etch selectivity.

SUMMARY

Embodiments are directed to an etching method, including providing a plasma of a first treatment gas to an etching-object to form a deposition layer on the etching-object, the first treatment gas including a fluorocarbon gas and an inert gas, and the etching-object including a first region including silicon oxide and a second region including silicon nitride, providing a plasma of an inert gas to the etching-object having the deposition layer thereon to activate an etching reaction of the silicon oxide, wherein a negative direct current voltage is applied to an opposing part that is spaced apart from the etching-object so as to face an etching surface of the etching-object, the opposing part including silicon, and subsequently, providing a plasma of a second treatment gas to remove an etching reaction product, the second treatment gas including an inert gas and an oxygen-containing gas.

Embodiments are also directed to a method of manufacturing a semiconductor device, the method including forming an upper insulation interlayer including silicon oxide and covering a capping pattern and a lower insulation interlayer, the capping pattern being disposed on a gate structure, the lower insulation interlayer covering a source/drain layer adjacent to the gate structure, and forming a contact hole passing through the upper insulation interlayer and the lower insulation interlayer to expose the source/drain layer. Forming the contact hole may include forming a mask including silicon nitride on the upper insulation interlayer, providing a plasma of a first treatment gas to form a deposition layer on the mask and on an exposed upper surface of the upper insulation interlayer, the first treatment gas including a fluorocarbon gas and an inert gas, subsequently, providing a plasma of an inert gas to activate an etching reaction of the silicon oxide, wherein a negative direct current voltage is applied to an opposing part that is spaced apart from an etching-object to face an etching surface of the etching-object, the opposing part including silicon, and subsequently, providing a plasma of a second treatment gas to remove an etching reaction product, the a second treatment gas including an inert gas and an oxygen-containing gas.

Embodiments are also directed to a method of manufacturing a semiconductor device, the method including forming an insulation interlayer on a gate structure and on a source/drain layer adjacent to the gate structure, and forming a contact hole passing through the insulation interlayer to expose the source/drain layer, wherein forming the contact hole includes forming a mask including silicon nitride on the insulation interlayer, providing a plasma of a first treatment gas to form a deposition layer on the mask and on an exposed upper surface of the insulation interlayer, the first treatment gas including a fluorocarbon gas and an inert gas, subsequently, providing a plasma of an inert gas, wherein a silicon ion is applied to the deposition layer when the plasma of the inert gas is provided, and subsequently, providing a plasma of a second treatment gas that includes an inert gas and an oxygen-containing gas.

BRIEF DESCRIPTION OF THE DRAWINGS

Features will become apparent to those of skill in the art by describing in detail example embodiments with reference to the attached drawings in which.

DETAILED DESCRIPTION

Figure 1:
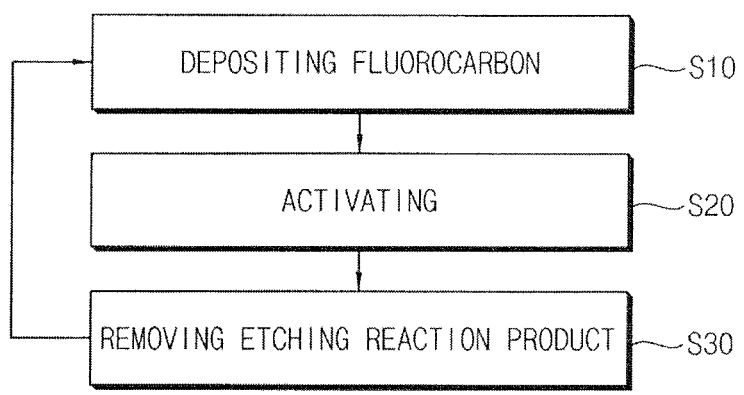
FIG. 1 illustrates a flow chart of an etching method according to an example embodiment.
Figure 2:
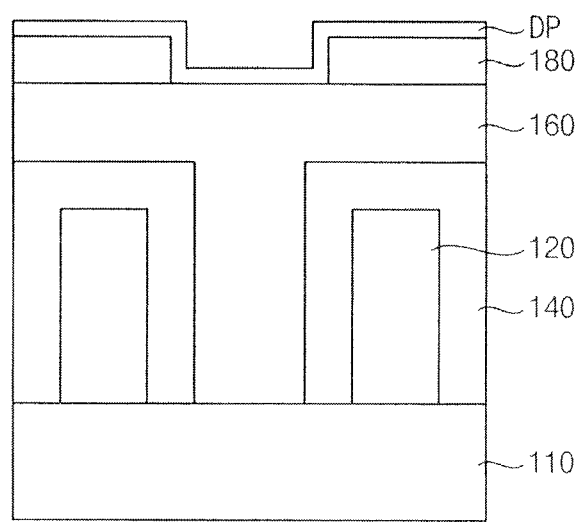
FIGS. 2 to 4 illustrate cross-sectional views of an etching-object in an etching method according to an example embodiment.
Figure 3:
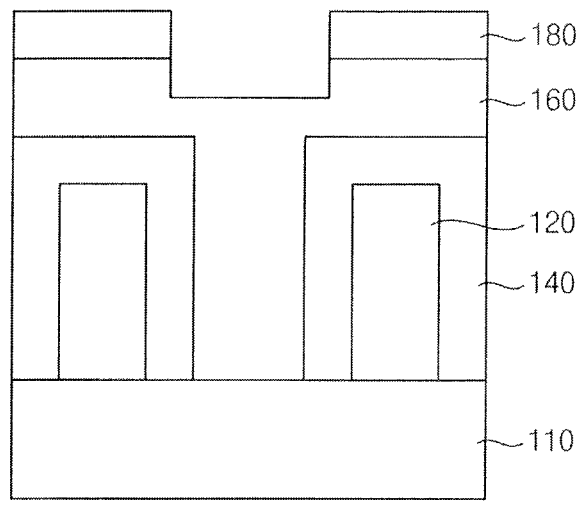
Figure 4:
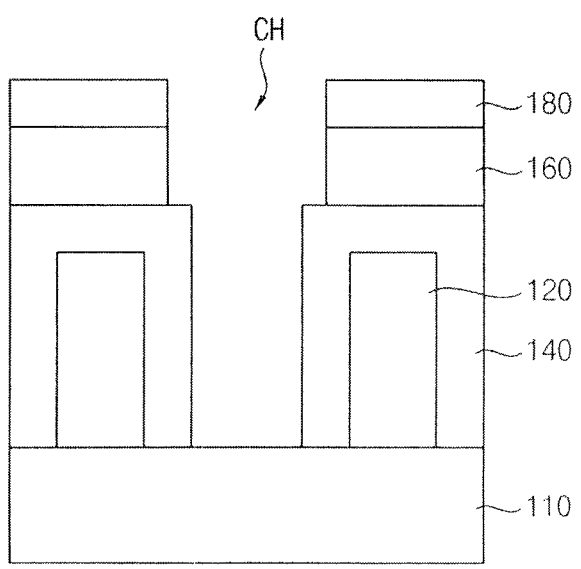

FIG. 1 is a flow chart explaining an etching method according to an example embodiment. FIGS. 2 to 4 are cross-sectional views illustrating an etching-object for explaining an etching method according to an example embodiment.

Referring to FIGS. 1 and 2, in the present example embodiment, a deposition layer DP including a fluorocarbon may be formed on a surface of an etching-object (S10).

An exposed upper surface of the etching-object may include a first region including, for example, silicon oxide and a second region including, for example, silicon nitride. For example, the etching-object may include a substrate 110, a plurality of protruding portions 120 disposed on the substrate 110, a protective portion 140 surrounding the protruding portions 120, a sacrificial layer 160 covering the protective portion 140 and including silicon oxide, and a mask 180 disposed on the sacrificial layer 160.

The protruding portions 120 may have a shape protruding upwardly from the substrate 110, and may be spaced apart from each other. For example, each of the protruding portions 120 may include a gate structure.

The protective portion 140 may surround the protruding portion 120. For example, the protective portion 140 may cover an upper surface and a side surface of the protruding portion 120. A plurality of protective portions 140 may be formed to respectively correspond to the protruding portions 120. The protective portions 140 adjacent to each other may be spaced apart from each other. The protective portion 140 may include a different material from the sacrificial layer 160, and may include, for example, silicon nitride.

The sacrificial layer 160 may cover the protective portion 140. Furthermore, the sacrificial layer 160 may fill a gap between the protective portions 140.

The mask 180 may partially cover the sacrificial layer 160 such that an upper surface of the sacrificial layer 160 may be exposed in a region where the mask 180 is not disposed. The mask 180 may be a hard mask including a different material from the sacrificial layer 160, and may include, for example, silicon nitride.

The deposition layer DP may be formed on an upper surface of the mask 180 and on an exposed surface of the sacrificial layer 160. The deposition layer DP may be also formed on a side surface of the mask 180 to have a conformal shape.

In order to form the deposition layer DP, a plasma of a treatment gas including a fluorocarbon gas may be provided to the etching-object. In an example embodiment, the treatment gas may include a fluorocarbon gas and an inert gas.

The fluorocarbon gas may include $C_4F_8$, $CF_4$, $C_4F_6$, or the like. These may be used each alone or in a combination thereof.

The inert gas may include argon (Ar), helium (He), neon (Ne), krypton (Kr), xenon (Xe), or the like. These may be used each alone or in a combination thereof. The inert gas used in the operation of deposition may be referred to as a first inert gas.

In an example embodiment, the treatment gas may include $C_4F_6$ gas and argon gas.

The deposition layer DP may include a fluorocarbon. For example, the deposition layer DP may include fluorocarbon provided by the treatment gas and/or $SiC_xF_y$ generated by reaction of fluorocarbon and silicon.

Referring again to FIG. 1, in operation S20, a plasma of an inert gas may be provided to the etching-object to activate an etching reaction. Thus, reaction of a fluorine-containing radical, such as a fluorine radical or a fluorocarbon radical, from the deposition layer DP and silicon oxide of the sacrificial layer 160 may be promoted.

For example, a fluorine-containing radical from the deposition layer DP may react with silicon oxide of the sacrificial layer 160 to generate silicon fluoride, for example, $SiF_4$ and carbon dioxide ($CO_2$). Furthermore, the fluorine-containing radical may react with silicon nitride of the mask 180. For example, the fluorine-containing radical may react with silicon nitride to generate silicon fluoride, for example, $SiF_4$ and silicon carbonitride (SiCN).

The inert gas may include argon (Ar), helium (He), neon (Ne), krypton (Kr), xenon (Xe), or the like. In an example embodiment, argon gas may be used. The inert gas used in the operation of activation may be referred to as a second inert gas.

In an example embodiment, a plasma may be generated from only the inert gas in the operation of activation so that a reactive radical of a treatment gas may not be generated.

In an example embodiment, as set forth in a additional detail below, a silicon ion may be provided to the surface of the etching-object in the operation of activation. The silicon ion may react with a fluorine-containing radical to generate silicon fluoride, for example, $SiF_4$. Thus, an amount of the fluorine-containing radical in the deposition layer DP or in a treatment space may be reduced. Therefore, loss of silicon nitride in the mask 180 may be reduced, that is, the etch rate of the silicon nitride in the mask 180 may be relatively reduced.

Providing the silicon ion to the surface of the etching-object may include, in an etching apparatus, applying a negative direct current voltage to an electrode that faces the etching-object. When the negative direct current voltage is applied to the electrode facing the etching-object, a cation of the inert gas may be provided to an opposing part formed of silicon and combined with the electrode. As a result, a silicon ion or a secondary electron may be released from the opposing part and provided to the surface of the etching-object. Furthermore, energy of the inert gas plasma provided to the etching-object may be increased. Thus, an etching ratio of silicon oxide may be prevented from being reduced even if an amount of the fluorine-containing radical is reduced.

Referring again to FIG. 1, in operation S30, a plasma of a treatment gas including an oxygen-containing gas and an inert gas may be provided to the etching-object to remove an etching reaction product.

The oxygen-containing gas may include oxygen gas ($O_2$), carbon dioxide gas, carbon monoxide gas or the like. These may be used each alone or in a combination thereof. The inert gas may include argon (Ar), helium (He), neon (Ne), krypton (Kr), xenon (Xe), or the like. In an example embodiment, argon gas may be used. The inert gas used in the operation of removing an etching reaction product may be referred to as a third inert gas.

An etching reaction product, for example, $SiF_4$ and carbon dioxide may be easily exhausted because of having a relatively high volatility. By forming the plasma to include an oxygen radical, the plasma may remove at least a portion of the deposition layer DP. In an example embodiment, the operation S30 of removing the etching reaction product may be performed after the operation S20 of activation.

With respect to layers containing silicon nitride, silicon carbonitride (SiCN) (generated by reaction of a fluorine-containing radical and silicon nitride) may remain because of having a relatively low volatility. Thus, an etching ratio of the sacrificial layer 160 including silicon oxide may be much greater than an etching ratio of the mask 180 including silicon nitride.

According the present example embodiment, the operation of deposition, the operation of deposition and the operation of removing the reaction product may be repeated to selectively and preferentially etch silicon oxide. Thus, as illustrated in FIG. 3, the sacrificial layer 160 may be selectively etched relative to the mask 180.

As etching is performed, the protective portion 140 may be exposed. In an example embodiment, the protective portion 140 may include silicon nitride. Thus, selectively etching the sacrificial layer 160 may be continuously performed. For example, the sacrificial layer 160 between the protective portions 140 may be removed to form a contact hole CH for a self-aligned contact.

For ease of explanation, the contact hole CH is described as exposing an upper surface of the substrate 110 in FIG. 4 but it will be understood that a layer other than the substrate 110 may be exposed. For example, in an example embodiment, the contact hole CH may expose a metal layer disposed on the substrate 110.

In an example embodiment, a plasma etching apparatus may be used for performing an etching method.

Figure 5:
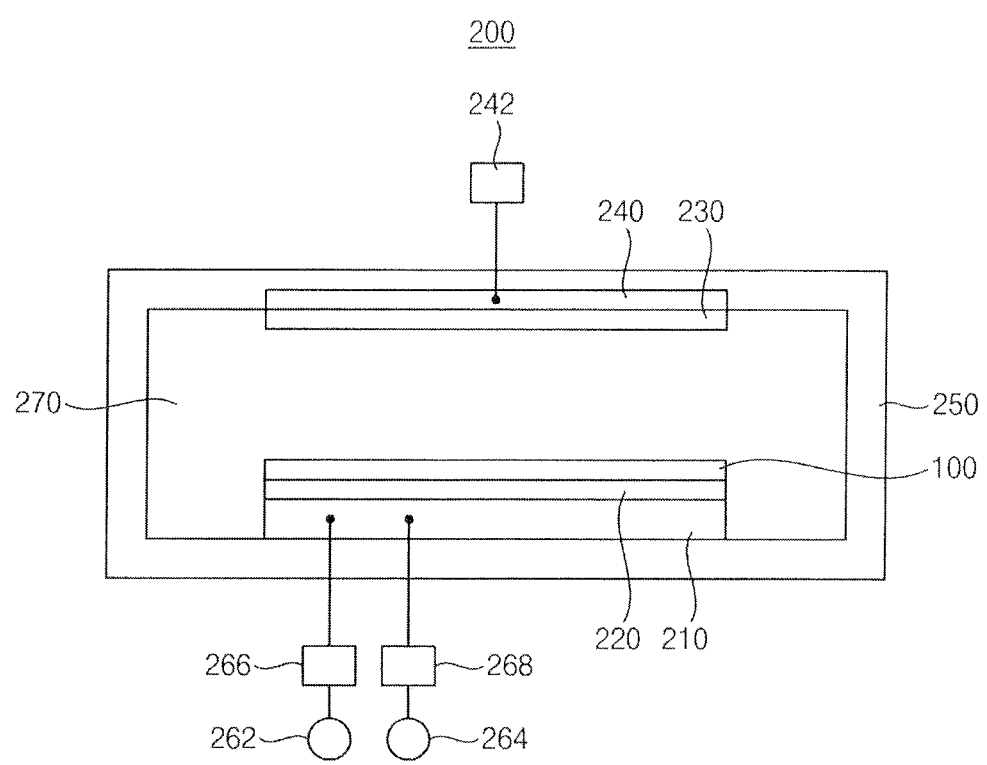
FIG. 5 illustrates a cross-sectional view of an etching-object and an etching apparatus for performing an etching method according to an example embodiment.

FIG. 5 is a cross-sectional view illustrating an etching-object and an etching apparatus for performing an etching method according to an example embodiment.

Referring to FIG. 5, a plasma etching apparatus 200 may include a fixing member for fixing an etching-object 100 (such as a wafer) thereto, a first electrode 210 disposed under the etching-object 100, an opposing part 230 disposed above and spaced apart from the etching-object 100, a second electrode 240 combined with the opposing part 230, and a container 250 forming a receiving space and a treatment space. The plasma etching apparatus 200 may be a capacitively coupled plasma etching apparatus.

The fixing member 220 may include, for example, an electrostatic chuck. A power source is connected to the electrostatic chuck to attach to the etching-object 100 by an electrostatic force.

The first electrode 210 may be connected to a high-frequency power source. For example, the first electrode 210 may be connected to a first high-frequency power source 262 and a second high-frequency power source 264.

The first high-frequency power source 262 may generate a high-frequency bias to direct ions to the etching-object 100. For example, the first high-frequency power source 262 may generate a high-frequency bias in a range of about 400 KHz to about 15 MHz.

The second high-frequency power source 264 may generate a high-frequency to generate a plasma. For example, the second high-frequency power source 264 may generate a high-frequency in a range higher than the first high-frequency power source 262, for example, in a range of about 20 MHz to about 100 MHz.

The first high-frequency power source 262 and the second high-frequency power source 264 may be connected to the first electrode 210 through a first adaptor 266 and a second adaptor 268, respectively. The first adaptor 266 and the second adaptor 268 may each include a circuit for matching output impedance of a high-frequency power source to input impedance of a load part.

In another example embodiment, the second high-frequency power source 264 may be connected to the second electrode 240.

The opposing part 230 may be combined with the second electrode 240. A lower surface of the opposing part 230 may be exposed to the treatment space 270. In an example embodiment, the opposing part 230 may include silicon, which may be exposed to the treatment space 270.

The second electrode 240 may be connected to an upper power source 242. For example, the upper power source 242 may provide a voltage for directing a cation in the treatment space 270 to the opposing part 230. For example, the upper power source 242 may apply a negative direct current voltage to the second electrode 240. When the negative direct current voltage is applied to the second electrode 240, the cation in the treatment space 270, for example, an argon ion, may collide with the opposing part 230. As a result, a silicon ion and/or a secondary electron may be released from the opposing part 230.

In an example embodiment, in the operation of activation (in which an inert gas plasma is provided), a negative direct current voltage may be applied to the second electrode 240 to form self-bias. Thus, a silicon ion may be released from the opposing part 230 and provided to the surface of the etching-object 100. The silicon ion may combine with a fluorine-containing radical in the deposition layer DP and thus reduce an amount of the fluorine-containing radical. Thus, an etching ratio of silicon nitride may be reduced thereby increasing an etching selectivity.

As discussed above, the self-bias of the second electrode 240 may take place during the operation of activation. By comparison, generation of the self-bias in another operation using a different treatment gas (for example, an oxygen-containing gas) may provide a lesser effect of removing a fluorine-containing radical because of the presence of radicals, for example, oxygen radicals.

The plasma etching apparatus 200 may further include a gas-providing pipe to supply a treatment gas, and an exhausting part to exhaust the treatment gas or the etching reaction product from the treatment space.

In an example embodiment, in the operation of deposition, a treatment gas including $C_4F_6$ gas and argon gas may be provided into the treatment space. For example, a discharge amount of the $C_4F_6$ gas may be 1 sccm to 50 sccm, and a discharge amount of the argon gas may be 100 sccm to 1,100 sccm. Furthermore, a power of a high-frequency for generating plasma may be 10 W to 500 W, and a power of a bias high-frequency may be 10 W to 1,000 W. Furthermore, a voltage in a range of −500 V to −1,000 V may be applied to the upper electrode, and a pressure in the container may be 10 mTorr to 100 mTorr. A treatment time may be 1 to 20 seconds.

In an example embodiment, in the operation of activation, a treatment gas including argon gas may be provided into the treatment space. For example, a discharge amount of the argon gas may be 100 sccm to 1,100 sccm. Furthermore, a power of a high-frequency for generating plasma may be 10 W to 500 W, and a power of a bias high-frequency may be 10 W to 1,000 W. Furthermore, a voltage in a range of −100 V to −600 V may be applied to the upper electrode, and a pressure in the container may be 10 mTorr to 100 mTorr. A treatment time may be 1 to 12 seconds.

Applying a voltage of −100 V or more (that is, or more negative relative to 0 V) may help ensure that the effect of preventing silicon nitride loss is at a desirable level. Applying a voltage of −600 V or less (that, or less negative relative to 0 V) may help ensure relatively a high removal rate of silicon oxide such that good etch selectivity is obtained, which may help, for example, open a contact.

In an example embodiment, in the operation of removing the reaction product, a treatment gas including oxygen gas and argon gas may be provided into the treatment space. For example, a discharge amount of the oxygen gas may be 1 sccm to 50 sccm, and a discharge amount of the argon gas may be 100 sccm to 1,100 sccm. Furthermore, a power of a high-frequency for generating plasma may be 10 W to 500 W, and a power of a bias high-frequency may be 10 W to 1.000 W. Furthermore, a voltage in a range of −500 V to −1,000 V may be applied to the upper electrode, and a pressure in the container may be 10 mTorr to 100 mTorr. A treatment time may be 1 to 20 seconds.

Method of Manufacturing a Semiconductor Device

FIGS. 6 to 29 are plan views and cross-sectional views illustrating stages of a method of manufacturing a semiconductor device according to an example embodiment. Particularly, FIGS. 6, 8, 11, 14, 17, 20, 22, and 28 are plan views, and FIGS. 7, 9, 10, 12, 13, 15, 16, 18, 19, 21, 23 to 27 and 29 are cross-sectional views.

Figure 9:
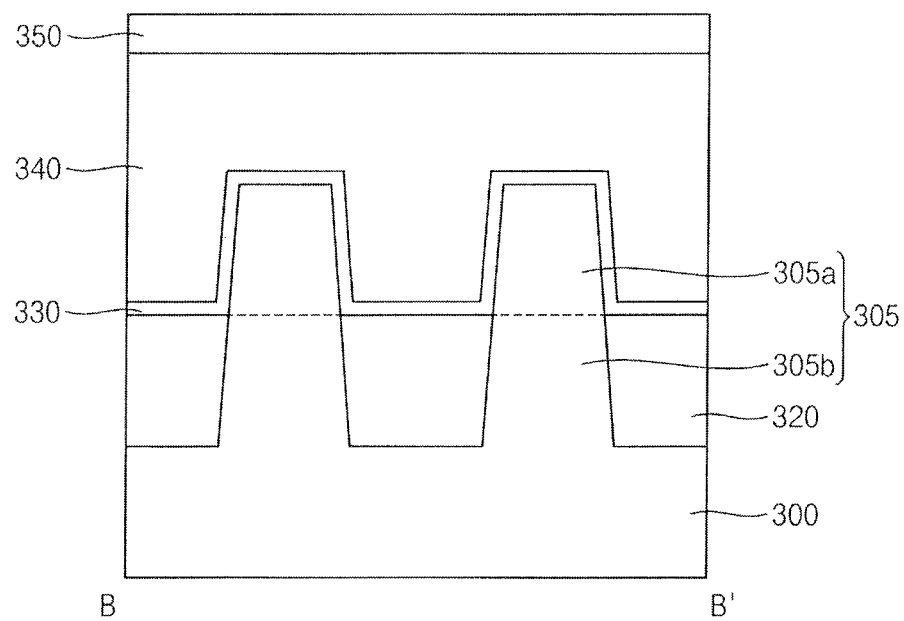
Figure 23:
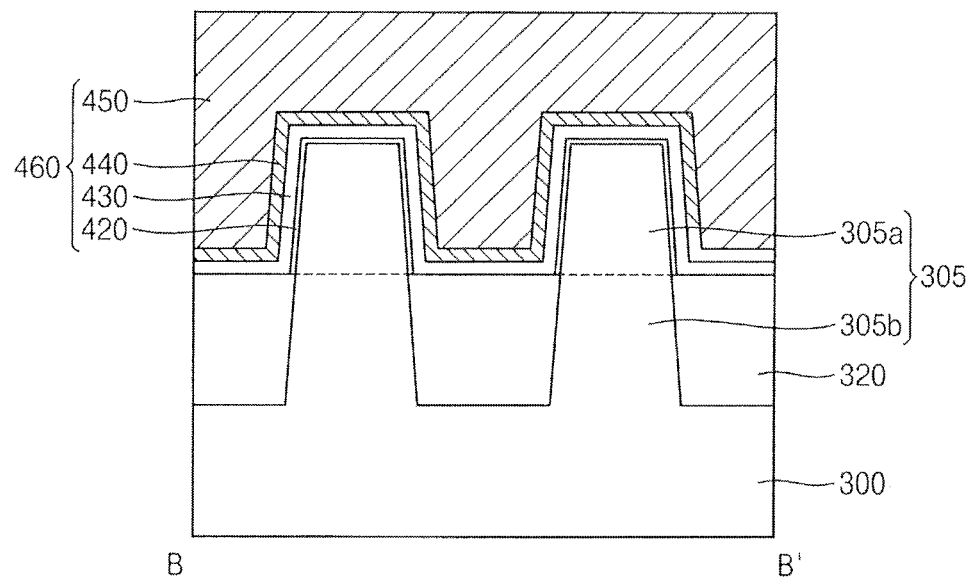

FIGS. 7, 12, 15 and 18 are cross-sectional views taken along lines A-A' of corresponding plan views, respectively, FIGS. 9 and 23 are cross-sectional views taken along lines B-B' of corresponding plan views, respectively, and FIGS. 10, 13, 16, 19, 21, 24 to 27 and 29 are cross-sectional views taken along lines C-C' of corresponding plan views, respectively.

Figure 6:
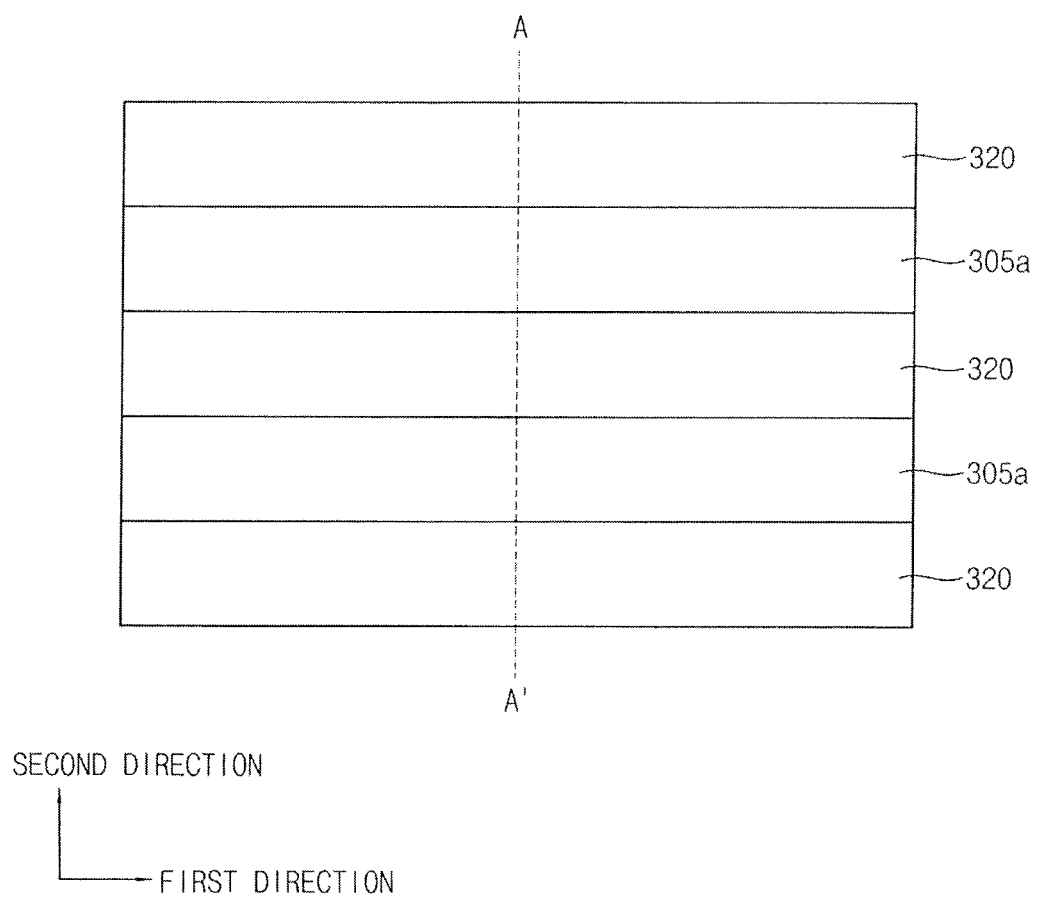
FIGS. 6, 8, 11, 14, 17, 20, 22, and 28 illustrate plan views of stages in an etching method according to an example embodiment.
Figure 7:
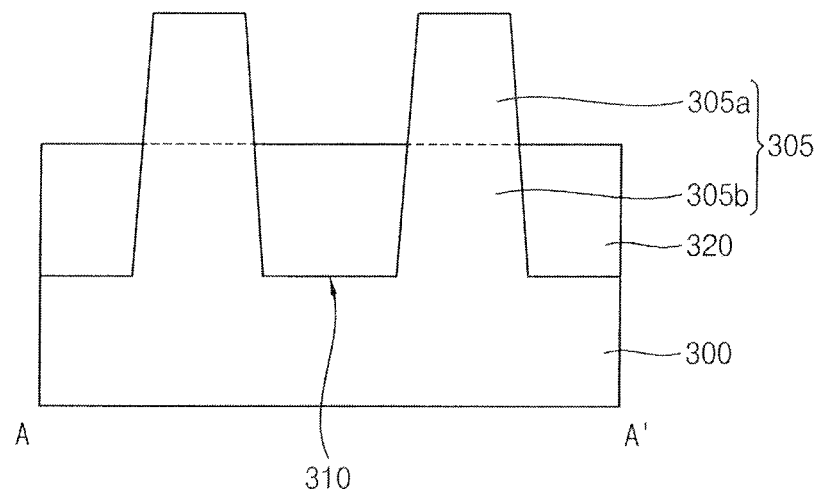
FIGS. 7, 9, 10, 12, 13, 15, 16, 18, 19, 21, 23 to 27, and 29 illustrate cross-sectional views of stages in an etching method according to an example embodiment.

Referring to FIGS. 6 and 7, an upper portion of a substrate 300 may be partially etched to form a first recess 310, and an isolation pattern 320 filling a lower portion of the first recess 310 may be formed.

As the first recess 310 is formed on the substrate 300, an active region 305 may be defined on the substrate 300. The active region 305 may protrude from an upper surface of the substrate 300, and thus may be also referred to as an active fin. A region of the substrate 300 on which the active fin 305 is not formed may be referred to as a field region.

In example embodiments, the active fin 305 may extend in a first direction substantially parallel to the upper surface of the substrate 300, and a plurality of active fins 305 may be arranged in a second direction, which may be substantially parallel to the upper surface of the substrate 300 and cross the first direction. In example embodiments, the first and second directions may cross each other at a right angle, and thus may be substantially perpendicular to each other.

In example embodiments, the isolation pattern 320 may be formed by forming an isolation layer on the substrate 300 to sufficiently fill the recess 310, planarizing the isolation layer until the upper surface of the substrate 300 is exposed, and removing an upper portion of the isolation layer to expose an upper portion of the recess 310. The isolation layer may be formed of, for example, an oxide, for example, silicon oxide.

In example embodiments, the active fin 305 may include a lower active pattern 305b whose sidewall is covered by the isolation pattern 320, and an upper active pattern 305a not covered by the isolation pattern 320 but protruding therefrom. In example embodiments, the upper active pattern 305a may have a width in the second direction that is slightly less than a width of the lower active pattern 305b.

Figure 8:
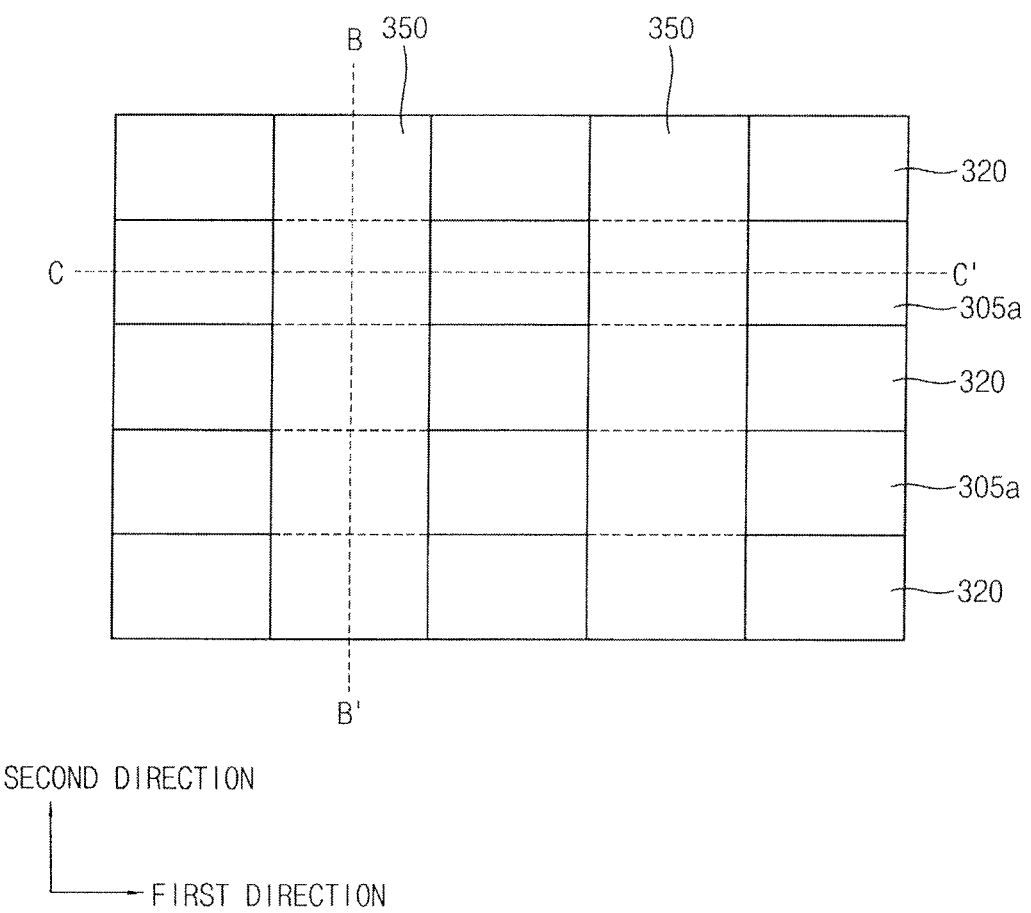
Figure 10:
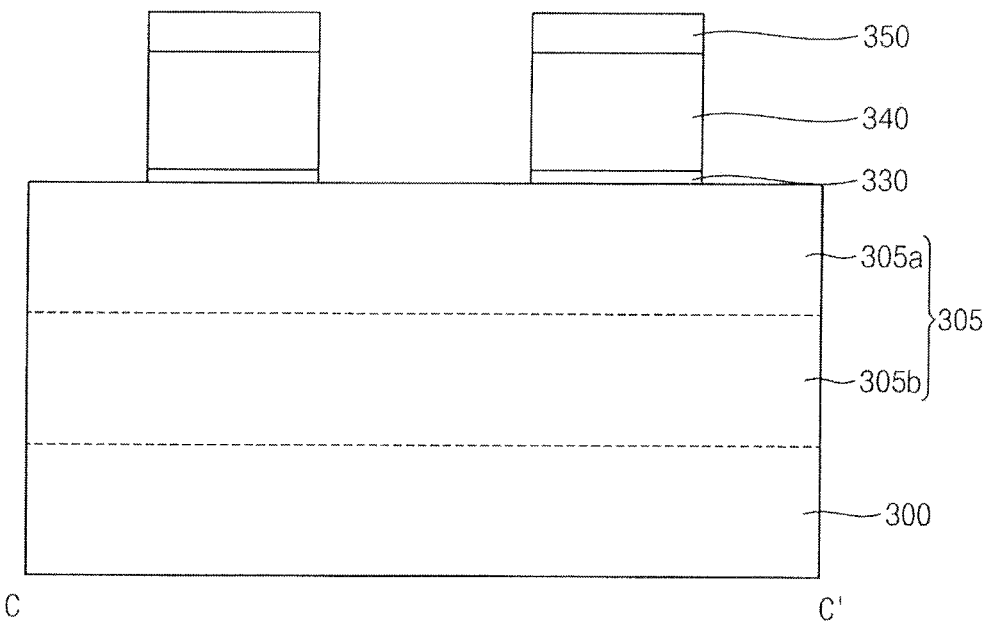

Referring to FIGS. 8 to 10, a dummy gate structure may be formed on the substrate 300.

In an example embodiment, the dummy gate structure may include a dummy gate insulation pattern 330, a dummy gate electrode 340 and the dummy gate mask 350 sequentially stacked on the substrate 300. The dummy gate structure may be formed by, for example, sequentially forming a dummy gate insulation layer, a dummy gate electrode layer and a dummy gate mask layer on the substrate 300 and the isolation pattern 320, patterning the dummy gate mask layer to form a dummy gate mask 350, and sequentially etching the dummy gate electrode layer and the dummy gate insulation layer using the dummy gate mask 350 as an etching mask.

The dummy gate insulation layer may be formed of, for example, an oxide, for example, silicon oxide, the dummy gate electrode layer may be formed of, for example, polysilicon, and the dummy gate mask layer may be formed of, for example, a nitride, for example, silicon nitride.

The dummy gate insulation layer may be formed by, for example, a chemical vapor deposition (CVD) process, an atomic layer deposition (ALD) process, or the like. In another implementation, the dummy gate insulation layer may be formed by a thermal oxidation process on an upper portion of the substrate 300, and in this case, the dummy gate insulation layer may be formed only on the upper active pattern 305a. The dummy gate electrode layer and the dummy gate mask layer may be formed by, for example, a CVD process, an ALD process, or the like.

In an example embodiment, the dummy gate structure may be formed to extend in the second direction, and a plurality of dummy gate structures may be arranged in the first direction.

Figure 11:
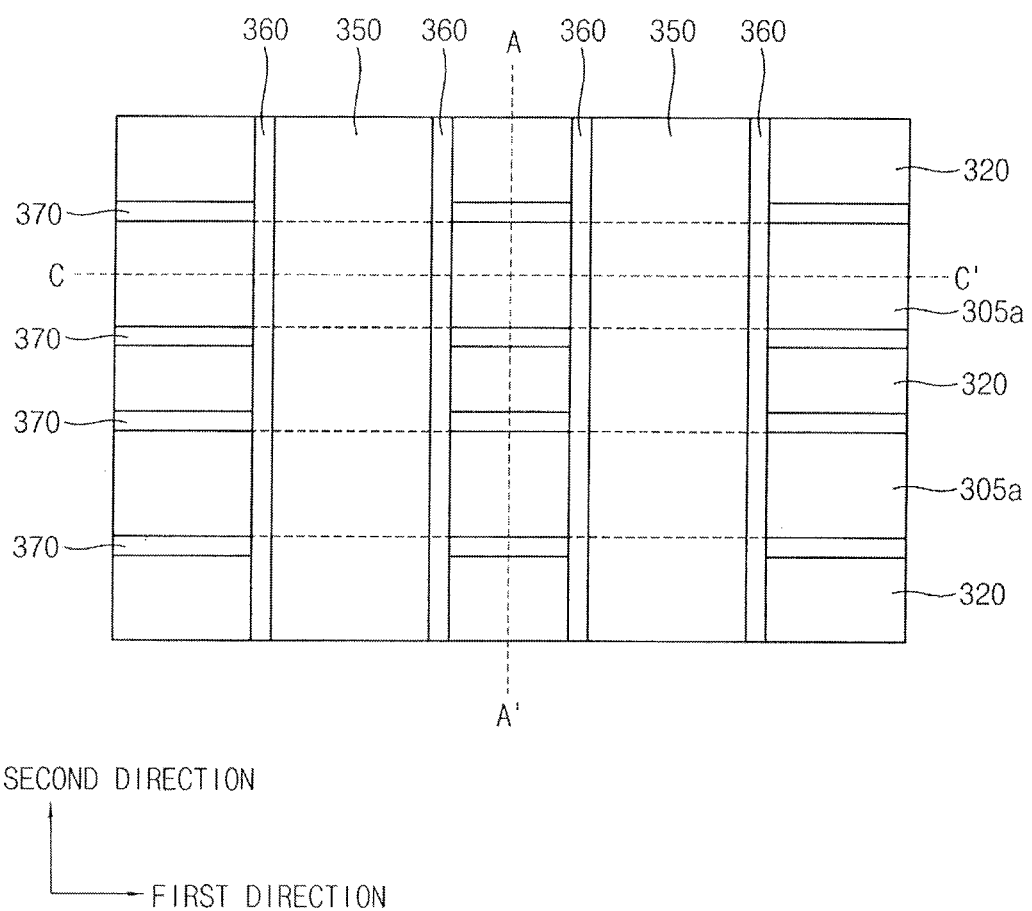
Figure 12:
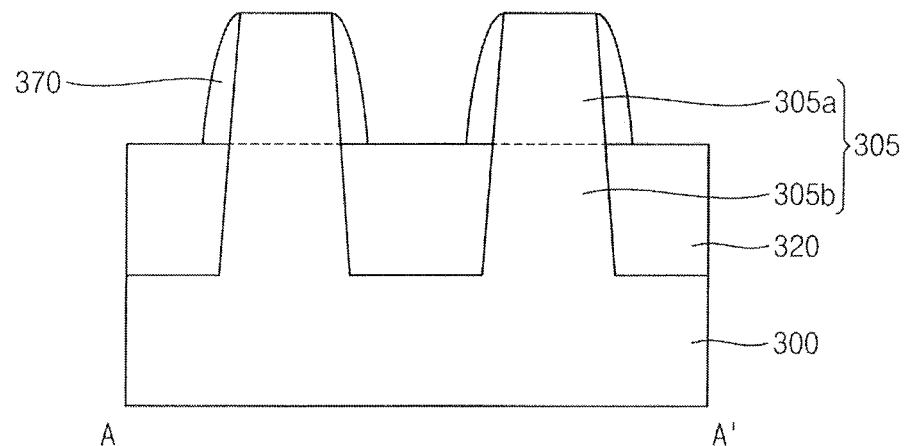
Figure 13:
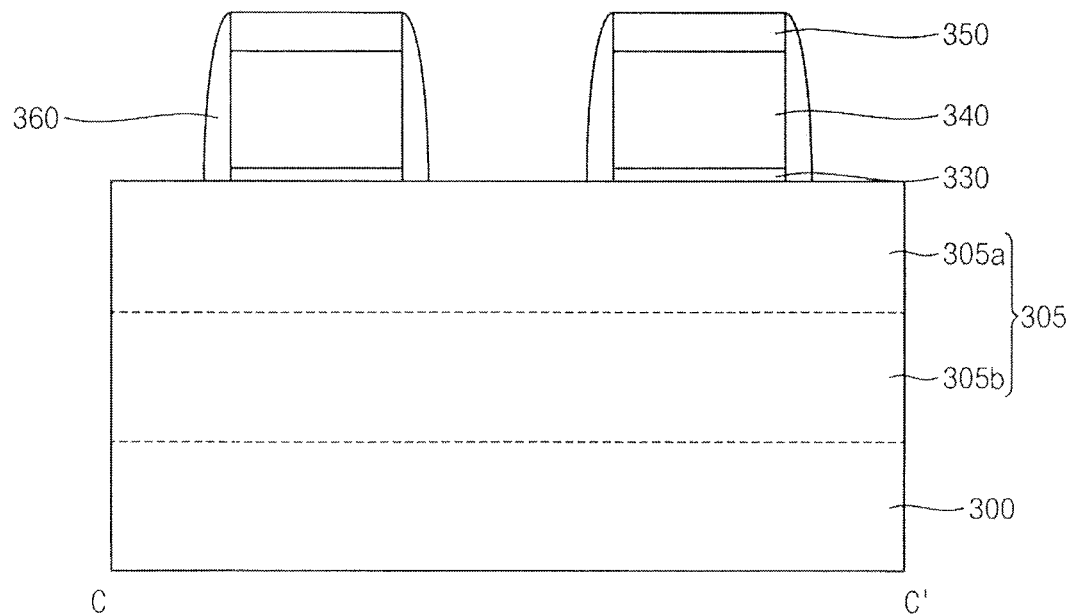

Referring to FIGS. 11 to 13, a spacer layer may be formed on the active fin 305 of the substrate 300 and the isolation pattern 320 to cover the dummy gate structure, and may be anisotropically etched to form a gate spacer 360 on each of opposite sidewalls of the dummy gate structure in the first direction. A fin spacer 370 may be formed on each of opposite sidewalls of the upper active pattern 305a in the second direction.

The spacer layer may be formed of, for example, a nitride, for example, silicon nitride.

Figure 14:
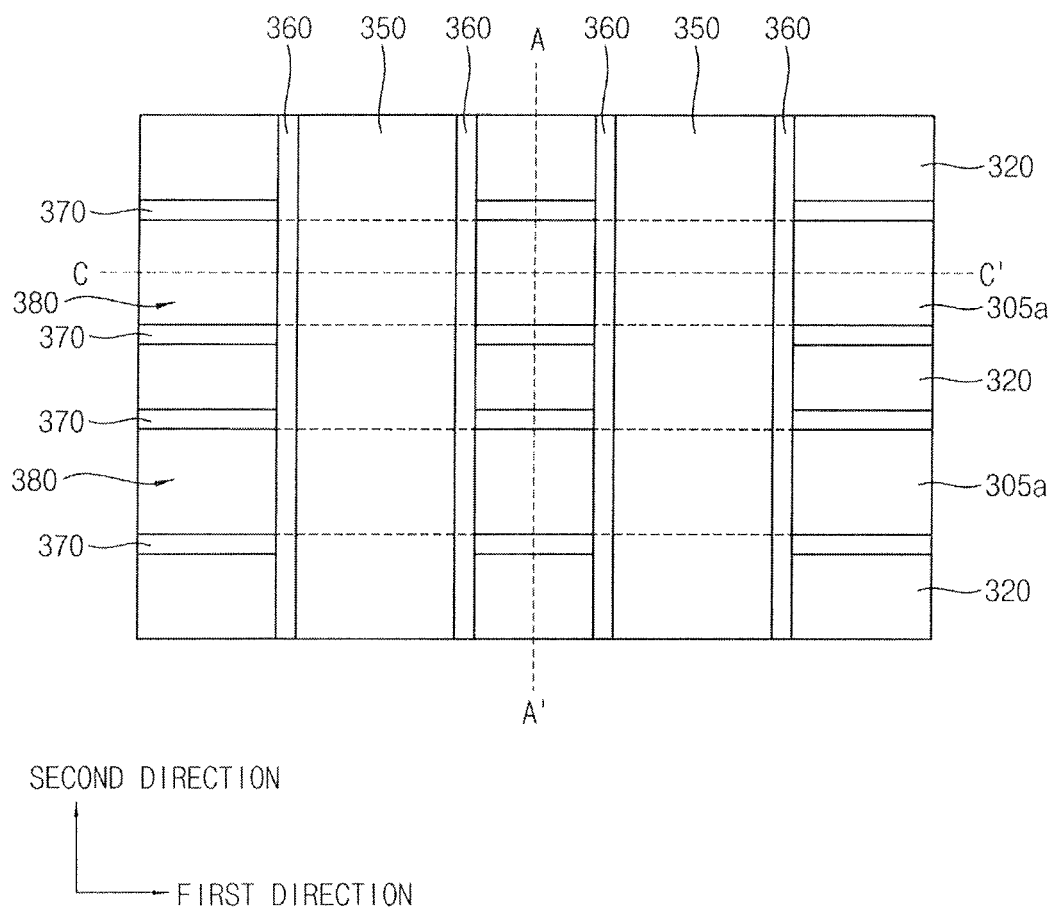
Figure 15:
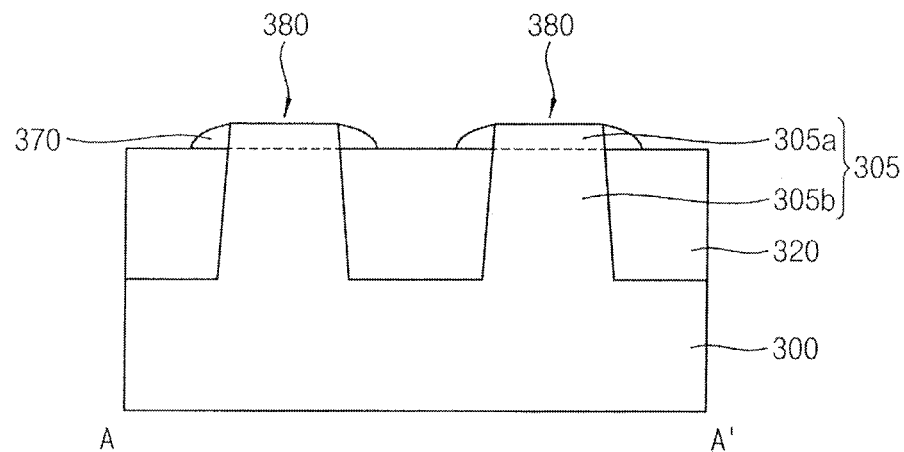
Figure 16:
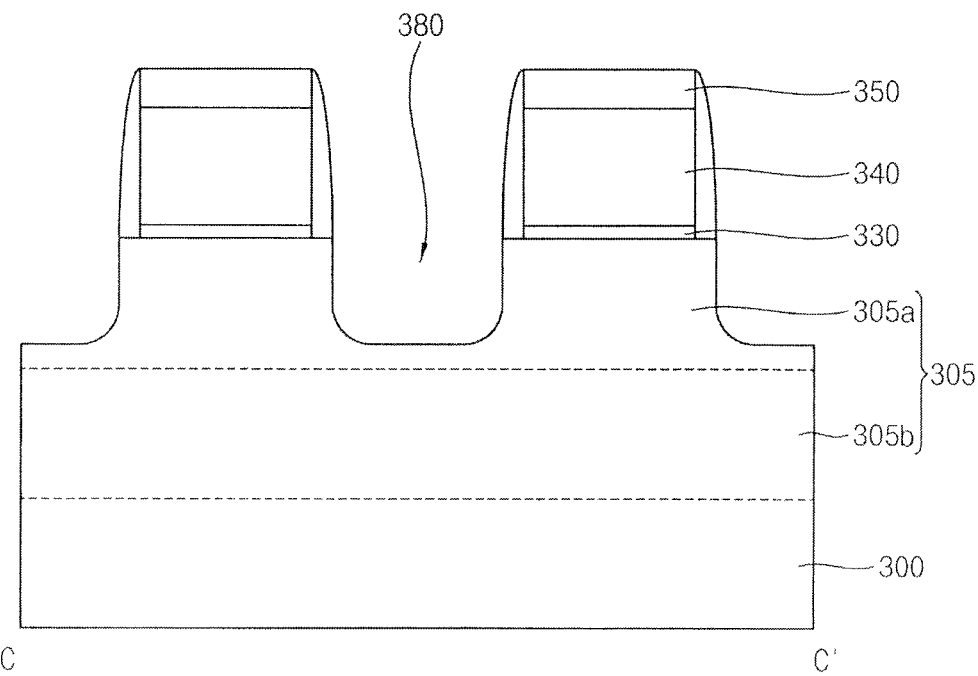

Referring to FIGS. 14 to 16, an upper portion of the active fin 305 adjacent the gate spacer 360 may be etched to form a second recess 380.

In the drawings, only a portion of the upper active pattern 305a of the active fin 305 is etched to form the second recess 380, and thus a bottom of the second recess 380 is higher than an upper surface of the lower active pattern 305b. In some embodiments, not only a portion of the upper active pattern 305a but also a portion of the lower active pattern 305b may be etched to form the second recess 380, and thus the bottom of the second recess 380 may be lower than an upper surface of the lower active pattern 305b where the second recess 380 is not formed.

When the second recess 380 is formed, the fin spacer 370 adjacent the upper active pattern 305a may be also removed partially or completely.

In example embodiments, the etching process for forming the second recess 380 and the etching process for forming the gate spacer 360 and the fin spacer 370 may be performed in-situ.

Figure 17:
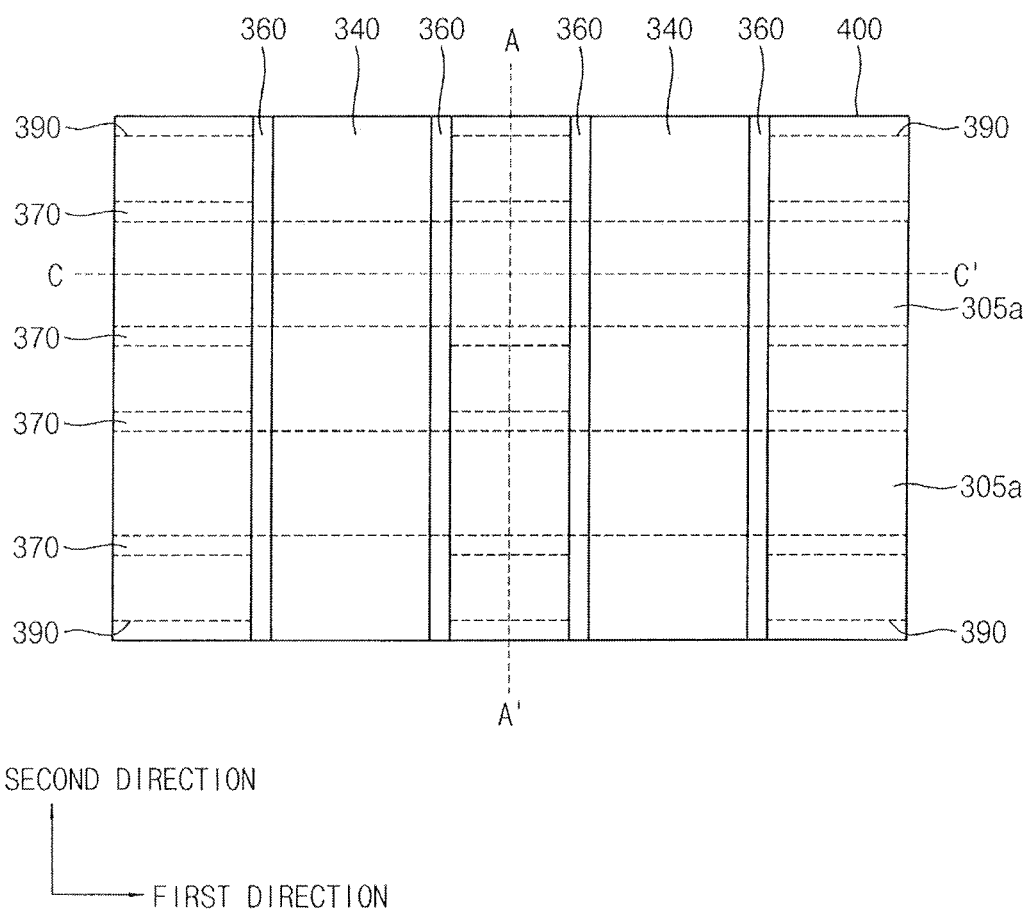
Figure 18:
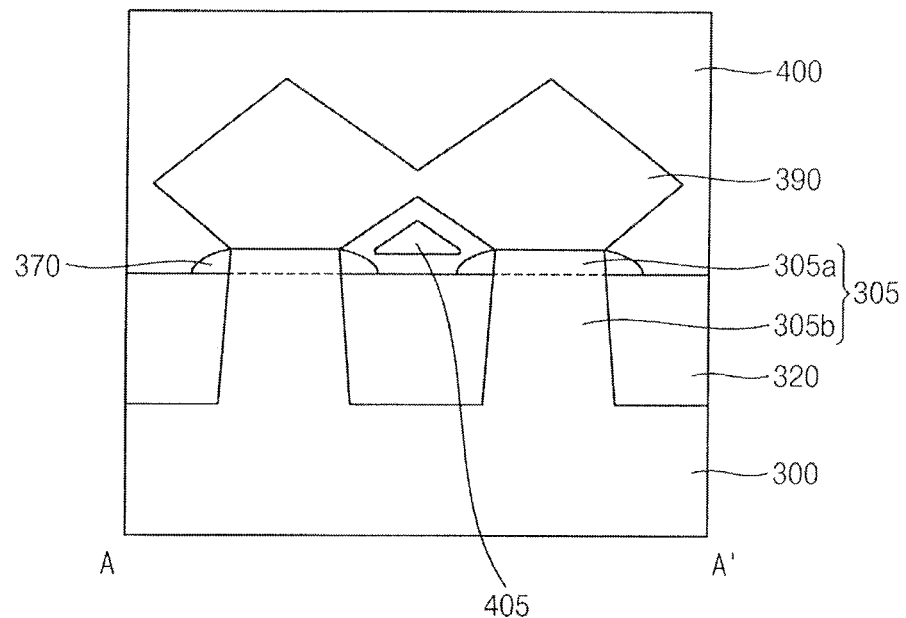
Figure 19:
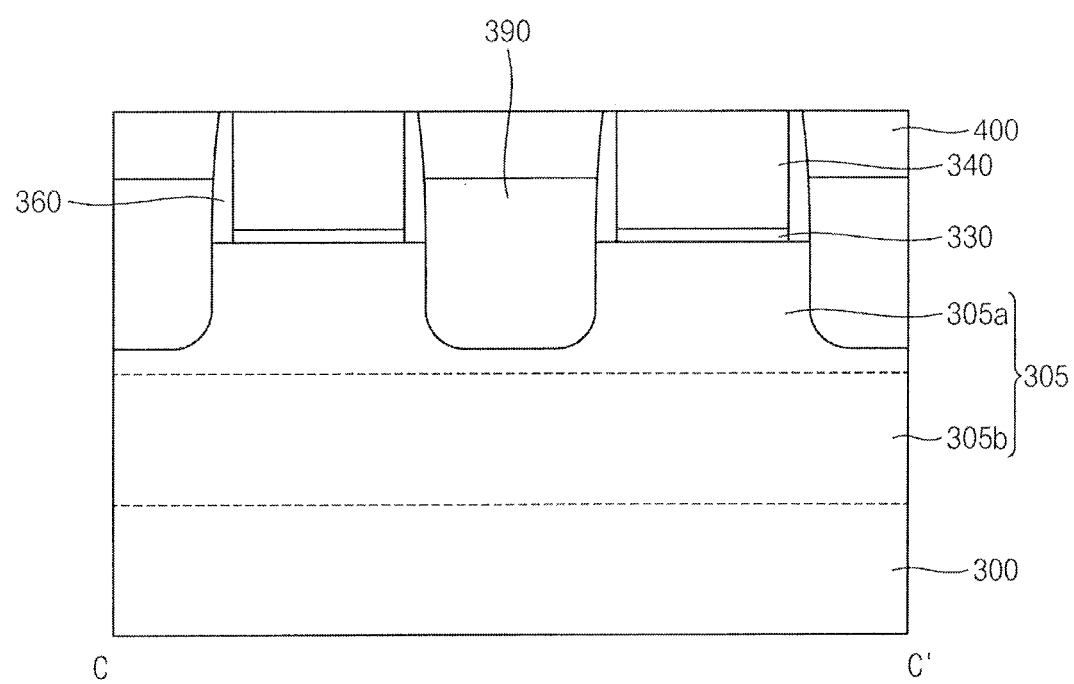

Referring to FIGS. 17 to 19, a source/drain layer 390 may be formed in the second recess 380.

In example embodiments, the source/drain layer 390 may be formed by, for example, a selective epitaxial growth (SEG) process using an upper surface of the active fin 305 exposed by the second recess 380 as a seed.

In example embodiments, the SEG process may be formed by, for example, providing a silicon source gas, a germanium source gas, an etching gas and a carrier gas, and thus a single crystalline silicon-germanium layer may be formed to serve as the source/drain layer 390. Additionally, a p-type impurity source gas may be also used to form a single crystalline silicon-germanium layer doped with p-type impurities serving as the source/drain layer 390. Thus, the source/drain layer 390 may serve as a source/drain region of a positive-channel metal oxide semiconductor (PMOS) transistor.

In another implementation, the SEG process may be formed using, for example, a silicon source gas, a carbon source gas, an etching gas and a carrier gas, and thus a single crystalline silicon carbide layer may be formed as the source/drain layer 390. Additionally, an n-type impurity source gas may be also used to form a single crystalline silicon carbide layer doped with n-type impurities. In another implementation, the SEG process may be performed using, for example, a silicon source gas, an etching gas and a carrier gas, and thus a single crystalline silicon layer may be formed as the source/drain layer 390. In the SEG process, an n-type impurity source gas may be also used to form a single crystalline silicon layer doped with n-type impurities. Thus, the source/drain layer 390 may serve as a source/drain region of a negative-channel metal oxide semiconductor (NMOS) transistor.

The source/drain layer 390 may grow not only in a vertical direction but also in a horizontal direction to fill the second recess 380, and may contact a sidewall of the gate spacer 360. In example embodiments, the source/drain layer 390 may have a cross-section taken along the second direction, and the cross-section of the source/drain layer 390 may have a shape similar to a pentagon.

In example embodiments, when the active fins 305 disposed in the second direction are close to each other, the source/drain layers 390 growing on the respective active fins 305 may be merged with each other. The drawings show that two source/drain layers 390 grown on neighboring two active fins 305 are merged with each other. In another embodiment, more than two source/drain layers 390 may be merged with each other.

Thereafter, a lower insulation interlayer 400 may be formed on the active fin 305 and the isolation pattern 320 to cover the dummy gate structure, the gate spacer 360, the fin spacer 370 and the source/drain layer 390 to a sufficient height, and may be planarized until an upper surface of the dummy gate electrode 340 of the dummy gate structure is exposed. In the planarization process, the dummy gate mask 350 may be also removed.

A space between the merged source/drain layers 390 and the isolation pattern 320 may not be filled with the lower insulation interlayer 400, and thus an air gap 405 may be formed.

The lower insulation interlayer 400 may be formed of, for example, silicon oxide or tonen silazene (TOSZ). The planarization process may be performed by, for example, a chemical mechanical polishing (CMP) process and/or an etch back process.

Figure 20:
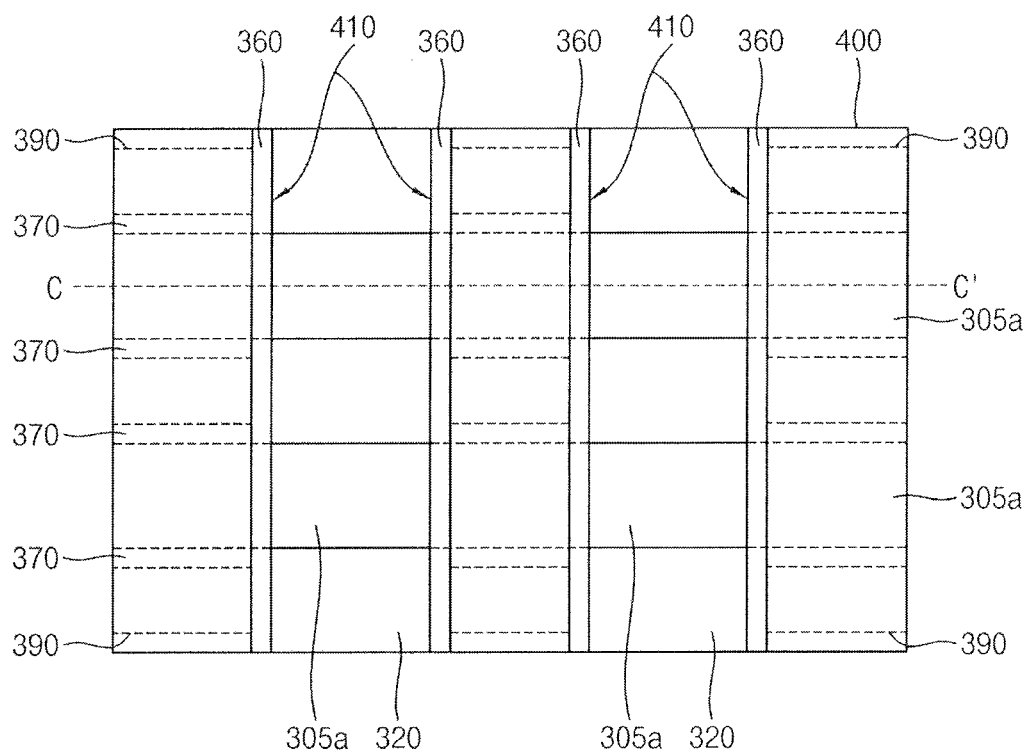
Figure 21:
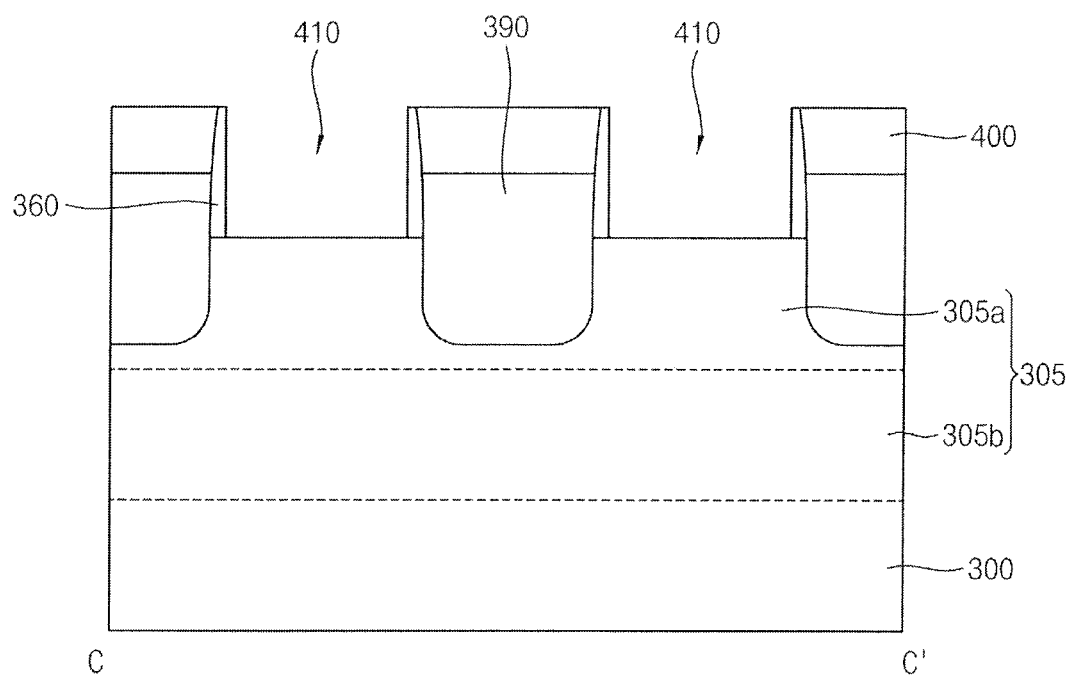
Figure 22:
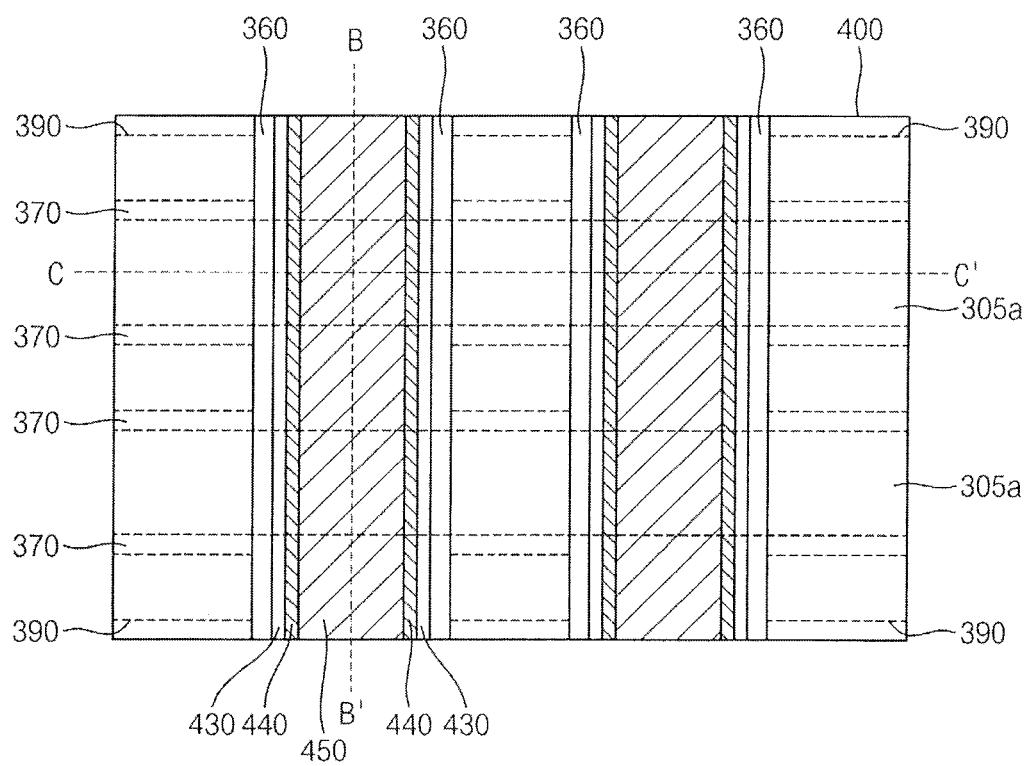

Referring to FIGS. 20 and 21, the exposed dummy gate electrode 340 and the dummy gate insulation pattern 330 thereunder may be removed to form an opening 410 exposing an inner sidewall of the gate spacer 360 and an upper surface of the active fin 305.

Referring to FIGS. 22 to 25, a gate structure 460 may be formed to fill the opening 410.

For example, after performing a thermal oxidation process on the upper surface of the active fin 305 exposed by the opening 410 to form an interface pattern 420, a gate insulation layer and a work function control layer may be sequentially formed on the interface pattern 420, the isolation pattern 320, the gate spacer 360, and the lower insulation interlayer 400, and a gate electrode layer may be formed on the work function control layer to sufficiently fill a remaining portion of the opening 410.

The gate insulation layer may be formed of, for example, a metal oxide having a high dielectric constant, for example, hafnium oxide ($HfO_2$), tantalum oxide ($Ta_2O_5$), zirconium oxide ($ZrO_2$) or the like, by a CVD process or an ALD process. The work function control layer may be formed of, for example, a metal nitride or a metal alloy, such as titanium nitride, titanium aluminum, titanium aluminum nitride, tantalum nitride, tantalum aluminum nitride or the like, and the gate electrode layer may be formed of a material having a low resistance such as a metal like aluminum, copper, tantalum, or the like, or a metal nitride thereof. The work function control layer and the gate electrode layer may be formed by, for example, an ALD process, a physical vapor deposition (PVD) process or the like. In an example embodiment, a heat treatment process, for example, a rapid thermal annealing (RTA) process, a spike rapid thermal annealing (spike RTA) process, a flash rapid thermal annealing (flash RTA) process or a laser annealing process may be further performed.

In an implementation, the interface pattern 420 may be formed instead of the thermal oxidation process, by a CVD process, an ALD process, or the like, similarly to the gate insulation layer or the gate electrode layer. In this case, the interface pattern 420 may be formed not only on the upper surface of the active fin 305 but also on the upper surface of the isolation pattern 320 and the inner sidewall of the gate spacer 360.

The gate electrode layer, the work function control layer, and the gate insulation layer may be planarized until an upper surface of the lower insulation interlayer 400 is exposed to form a gate insulation pattern 430 and a work function control pattern 440 sequentially stacked on the interface pattern 420, the isolation pattern 320, and the inner sidewall of the gate spacer 360, and a gate electrode 450 filling the remaining portion of the opening 410 on the work function control pattern 440.

The interface pattern 420, the gate insulation pattern 430, the work function control pattern 440 and the gate electrode 450 sequentially stacked may form the gate structure 460, and the gate structure 460 together with the source/drain layer 390 may form a PMOS transistor or an NMOS transistor according to the conductivity type of the source/drain layer 390.

Figure 24:
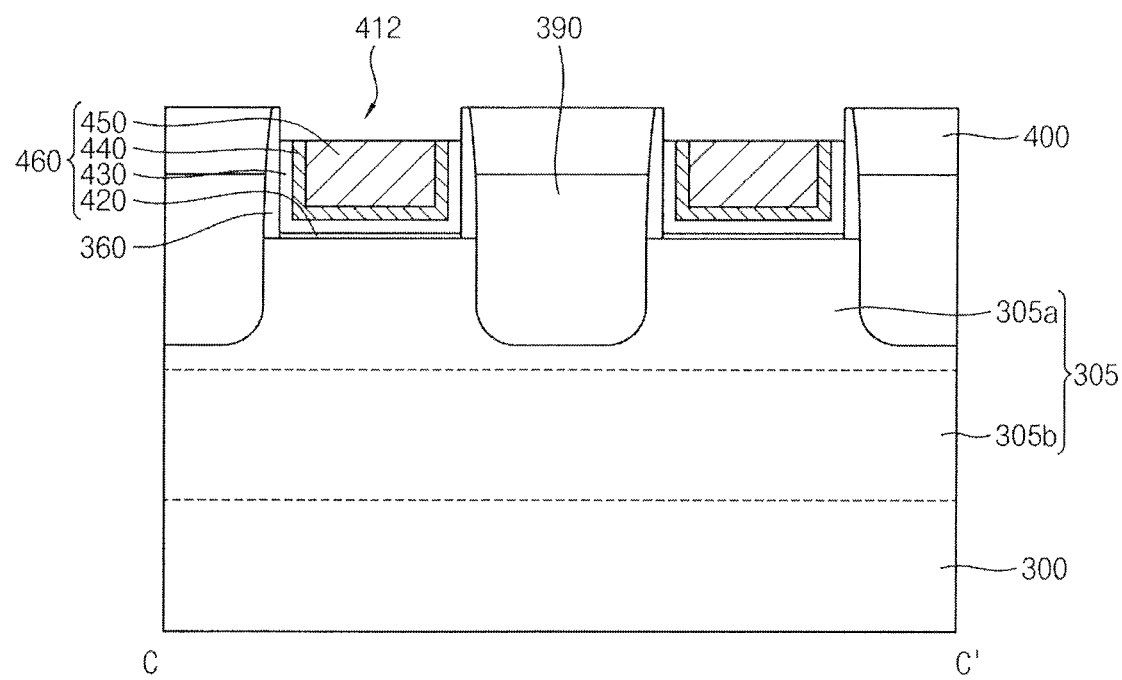

In an example embodiment, the gate structure 460 may be further etched to form a capping recess 412 recessed from an upper surface of the lower insulation interlayer 400, as illustrated in FIG. 24.

Figure 25:
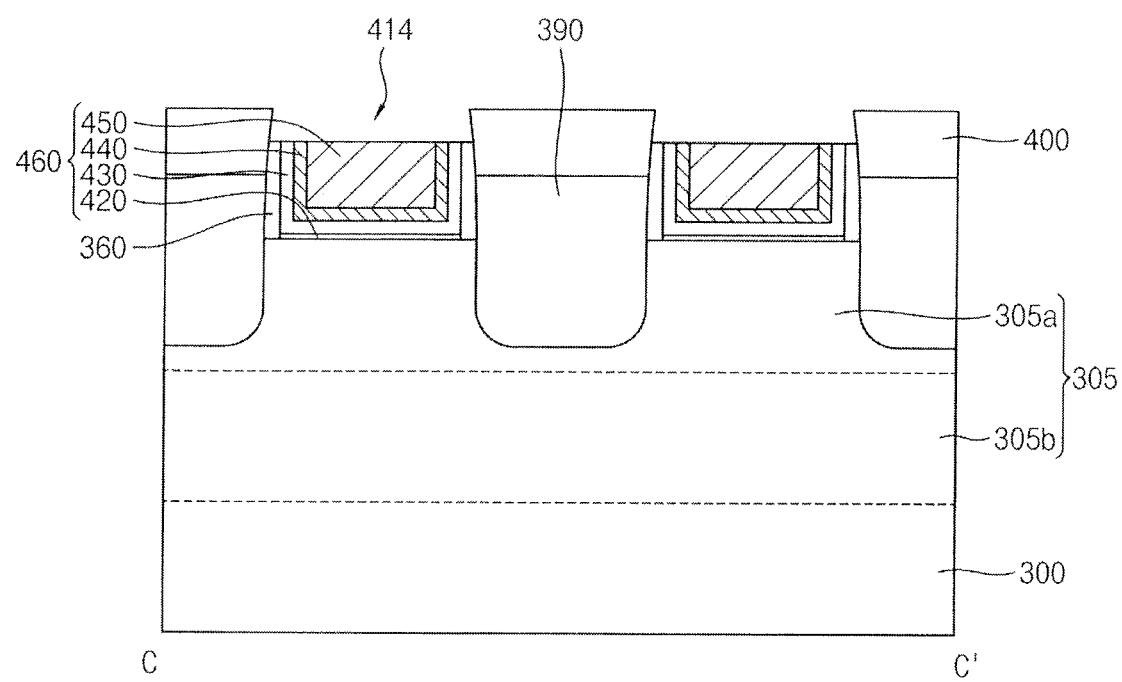
Figure 26:
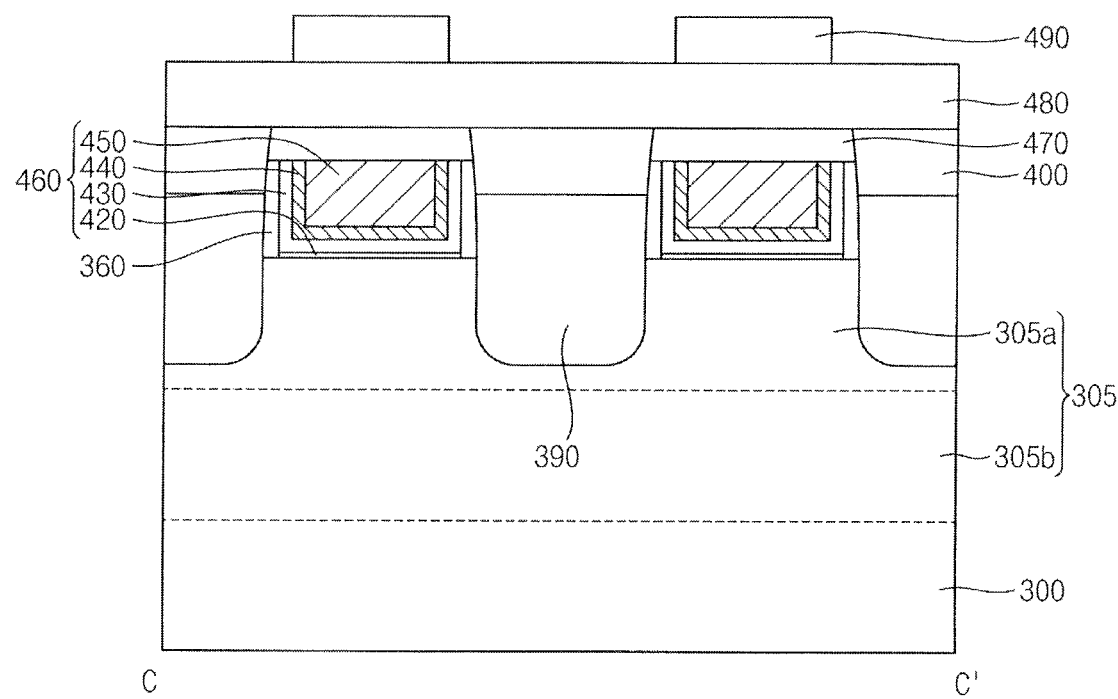

The gate spacer 360 adjacent to the gate structure 460 may be further etched to expand the capping recess 412 to be expanded capping recess 414, as illustrated in FIG. 25. Referring to FIG. 26, a capping pattern 470 may be formed to fill the expanded capping recess 414.

For example, a capping layer may be formed to fill the expanded capping recess 414 and to cover the lower insulation interlayer 400. The capping layer may be planarized, such that an upper surface of the lower insulation interlayer 400 is exposed, to form the capping pattern 470. The capping pattern 470 may be formed of, for example, a nitride, for example, silicon nitride.

An upper insulation interlayer 480 may be formed on the capping pattern 470 and the lower insulation interlayer 400. A mask 490 may be formed to partially cover the upper insulation interlayer 480. The mask 490 may include an opening exposing the upper insulation interlayer 480 and disposed on the source/drain layer 390.

The upper insulation interlayer 480 may be formed of silicon oxide, for example, tetraethyl ortho silicate (TEOS). The mask 490 may be formed of, for example, a nitride, for example, silicon nitride.

Figure 27:
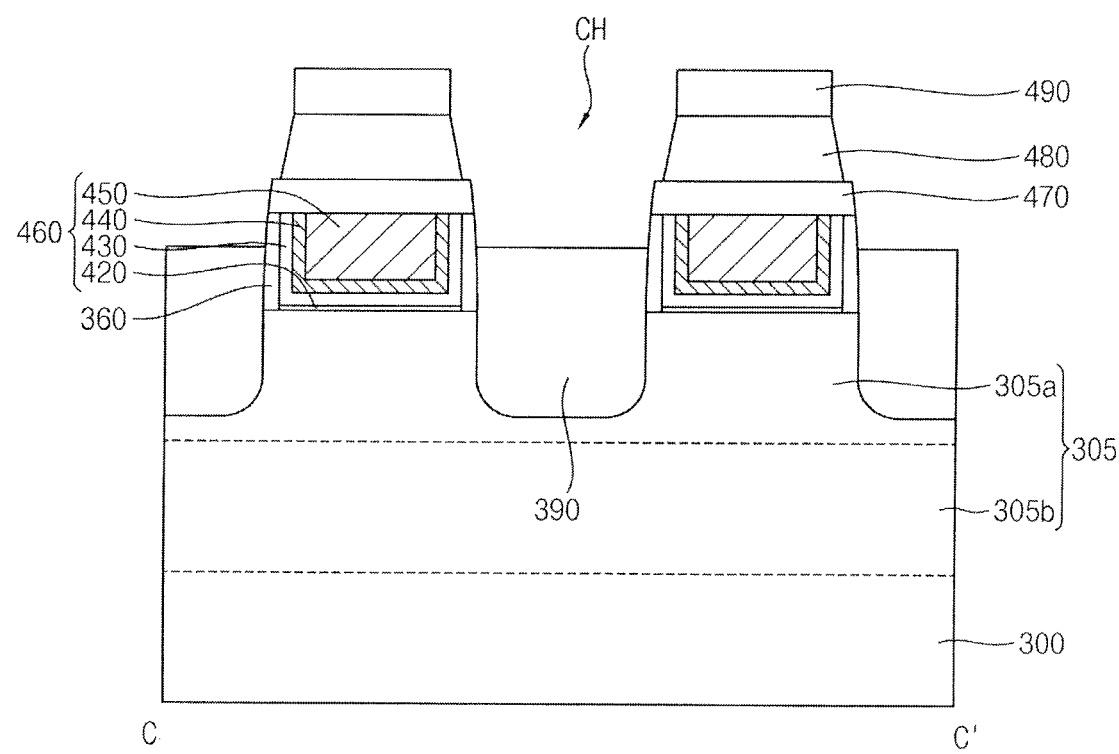

Referring to FIG. 27, a contact hole CH may be formed through the upper insulation interlayer 480 and the lower insulation interlayer 400. The contact hole CH may pass through the upper insulation interlayer 480 and the lower insulation interlayer 400 to expose an upper surface of the source/drain layer 390.

In forming the contact hole CH, the above-described etching method according to an example embodiment may be used.

For example, a plasma of a treatment gas including a fluorocarbon gas may be provided to form a deposition layer including fluorocarbon on the upper insulation interlayer 480 and on the mask 490. Thereafter, a plasma of an inert gas may be provided to activate reaction of silicon oxide of the upper insulation interlayer 480 and a fluorine-containing radical of the deposition layer. Thereafter, a plasma of a treatment gas including an oxygen-containing gas and an inert gas may be provided to remove an etching reaction product.

In an example embodiment, the contact hole CH may be formed along a side surface of the gate spacer 360 to be self-aligned with the gate spacer 360. Thus, a substantially entire upper surface of the source/drain layer 390 may be exposed. In another example embodiment, the contact hole CH may not be self-aligned with the gate spacer 360, and may, for example, expose a portion of an upper surface of the source/drain layer 390.

Figure 28:
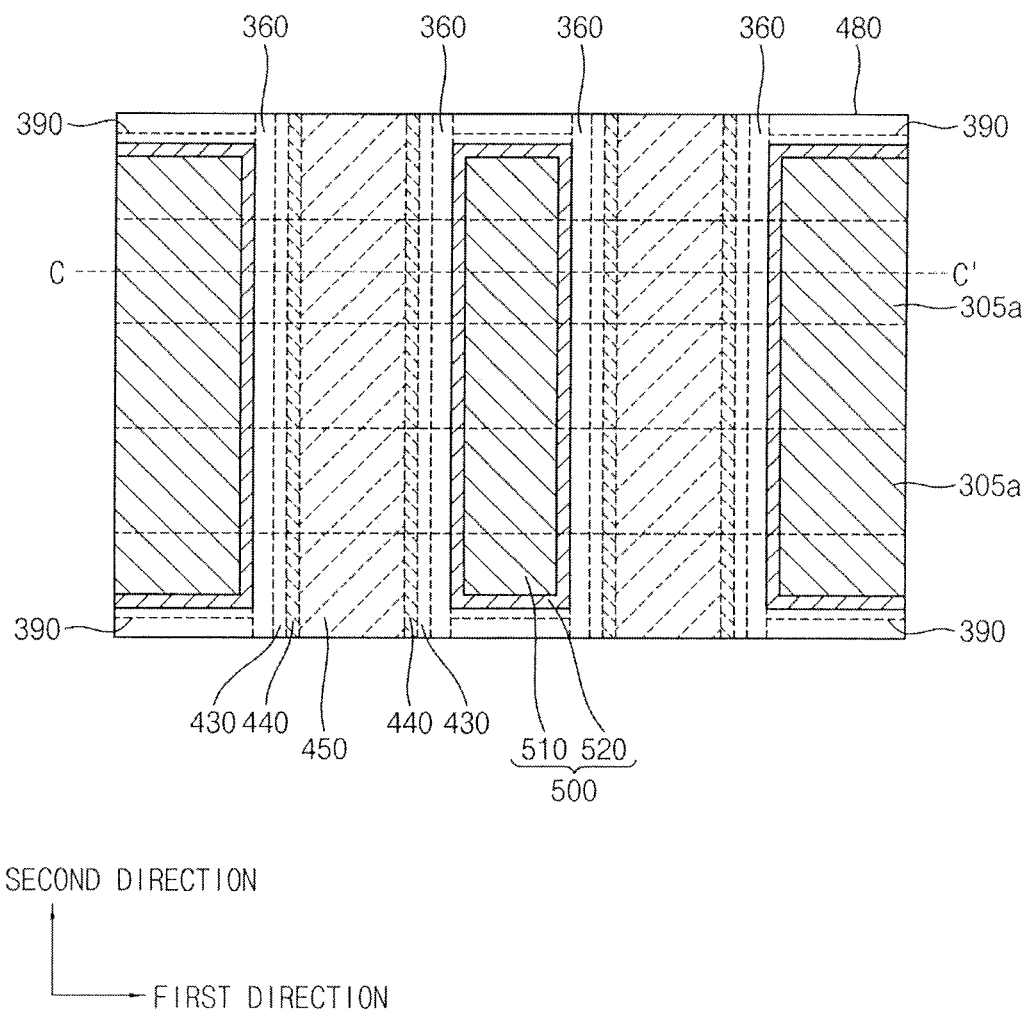
Figure 29:
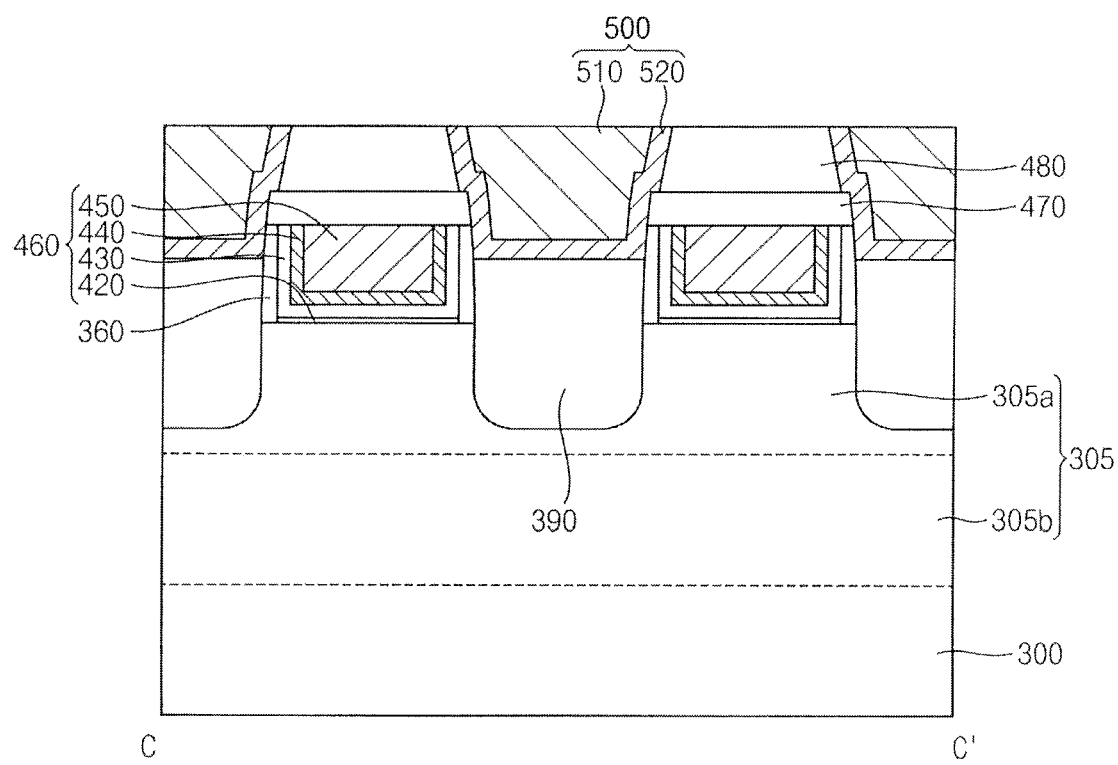

Referring to FIGS. 28 and 29, a contact plug 500 may be formed to fill the contact hole CH. The contact plug 500 may be connected to the source/drain layer 390. For example, the contact plug 500 may include a metal pattern 510 and a barrier pattern 520. The barrier pattern 520 may be formed to have a conformal shape on a sidewall of the contact hole CH and on an upper surface of the upper insulation interlayer 480. The barrier pattern 520 may cover a bottom surface and a side surface of the metal pattern 510.

For example, a barrier layer may be formed to have a conformal shape on an upper surface of the source/drain layer 390, the sidewall of the contact hole CH, and the upper surface of the upper insulation interlayer 480. A metal layer may be formed on the barrier layer to fill the contact hole CH. The metal layer and the barrier layer may be planarized, such that the upper surface of the upper insulation interlayer 480 is exposed, to form the metal pattern 510 and the barrier pattern 520.

In an example embodiment, before the barrier layer is formed, a metal silicide may be formed on the upper surface of the source/drain layer 390.

The contact plug 500 may be electrically connected to a wire structure.

According to an example embodiment, in the process of forming a contact hole CH in a semiconductor device, an etching selectivity of silicon oxide to silicon nitride may be increased. Thus, a short leakage may be prevented, and a source/drain layer may be stably opened. Thus, a reliability of the semiconductor device may be improved.

The following Example and Comparative Example are provided in order to highlight characteristics of one or more embodiments, but it will be understood that the Example and Comparative Example are not to be construed as limiting the scope of the embodiments, nor is the Comparative Example to be construed as being outside the scope of the embodiments. Further, it will be understood that the embodiments are not limited to the particular details described in the Example and Comparative Example.

Example 1

As illustrated in FIG. 2, a protruding portion 120 including a gate structure, and a protective portion 140 formed of silicon nitride were formed on a substrate 110. The protective portion 140 included a spacer contacting a side surface of the protruding portion 120, and a capping pattern covering an upper surface of the protruding portion 120.

Thereafter, a sacrificial layer 160 formed of TEOS and filling a gap between protective portions 140 and covering an upper surface of the protective portion 140 was formed to have a thickness of 30 nm, which was measured by a distance between an upper surface of the sacrificial layer 160 and the upper surface of the protective portion. A mask 180 including an opening overlapping the gap and formed of silicon nitride was formed on the sacrificial layer 160.

An etching process was performed to the above etching-object by a capacitively coupled plasma etching apparatus having a configuration as illustrated in FIG. 5 with the following conditions (50 cycles repeated) to form a contact hole CH exposing an upper surface of the substrate 110 between the protective portions 140 as illustrated in FIG. 4.

<Operation of Deposition>
$C_4F_6$ gas: 1 sccm to 50 sccm
Argon gas: 100 sccm to 1,100 sccm
Power of the high-frequency for generating plasma: 10 W to 500 W
Power of the bias high-frequency: 10 W to 1,000 W
Voltage of the upper electrode: −500 V to −1,000 V
Pressure: 10 mTorr to 100 mTorr
Treatment time: 1 to 20 seconds
<Operation of Activation>
Argon gas: 500 sccm
Power of the high-frequency for generating plasma: 100 W
Power of the bias high-frequency: 200 W
Voltage of the upper electrode: −500 V
Pressure: 20 mTorr
Treatment time: 6 seconds
<Operation of Removing Reaction Product>
Oxygen gas: 1 sccm to 50 sccm
Argon gas: 100 sccm to 1,100 sccm
Power of the high-frequency for generating plasma: 10 W to 500 W
Power of the bias high-frequency: 10 W to 1,000 W
Voltage of the upper electrode: −500 V to −1,000 V
Pressure: 10 mTorr to 100 mTorr
Treatment time: 1 to 20 seconds Comparative Example 1

An etching-object having a same configuration as Example 1 was etched with same conditions as Example 1 except for a negative direct current voltage being not applied to the upper electrode of the etching apparatus in the operation of activation.

Etching results of Example 1 and Comparative Example 1 are represented by the following Table 1.

TABLE 1

|  | Example 1 | Comparative Example 1 |
|---|---|---|
| Thickness of remaining mask (nm) | 20.13 | 12.56 |
| Etching selectivity (etching depth of sacrificial layer:reduced thickness of mask | about 11:1 | about 6:1 |
| Upper width of contact hole (nm) | 25.41 | 25.36 |
| Lower width of contact hole (nm) | 17.13 | 16.11 |

Referring to Table 1, a thickness of remaining mask in Example 1 was larger than that in Comparative Example 1. Thus, loss of silicon nitride was relatively reduced in Example 1, and Example 1 achieved an etching selectivity greater than Comparative Example 1.

Furthermore, a lower width of the contact hole in Example 1 was larger than that in Comparative Example 1. Thus, the sacrificial layer filling the gap between the protective portions was etched more in Example 1 than in Comparative Example 1. Thus, providing a negative direct current voltage to the upper electrode in the operation of activation may relatively increase etching of silicon oxide.

The above method of manufacturing the semiconductor device may be applied to methods of manufacturing various types of memory devices including wiring structures. For example, the method may be applied to methods of manufacturing logic devices such as central processing units (CPUs), main processing units (MPUs), or application processors (APs) or the like. Additionally, the method may be applied to methods of manufacturing volatile memory devices such as DRAM devices or SRAM devices, or non-volatile memory devices such as flash memory devices, PRAM devices, MRAM devices, RRAM devices or the like.

By way of summation and review, in manufacturing a device such as a semiconductor device, a process may include selectively etching a region including silicon oxide. For example, a method for forming a self-aligned contact by selectively etching a region including silicon oxide may be performed. As a degree of integration increases and finer processes are introduced, a contact may not be formed or a short leakage may be caused if sufficient etching selectivity cannot be obtained.

As described above, embodiments may provide an etching method having a high etching selectivity. Embodiments may provide a method of manufacturing a semiconductor device having superior characteristics.

According to an example embodiment, in an activation operation providing a plasma of an inert gas, a negative direct current voltage may be applied to an opposing part to form a self-bias. Thus, a silicon ion may be released from the opposing part and directed to a surface of an etching-object. The silicon ion may react with a fluorine-containing radical in a deposition layer deposited on a surface of the etching object to reduce an amount of the fluorine-containing radical. Thus, etching of, for example, silicon nitride may be reduced so as to increase etching selectivity.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An etching method, comprising:
    forming a mask pattern that includes silicon nitride on top of a target layer that includes silicon oxide such that the mask pattern exposes a first region of the target layer and covers a second region of the target layer;
    forming a fluorocarbon-containing deposition layer directly on the exposed first region of the target layer and directly on the second region of the target layer by providing a plasma of a first treatment gas that includes a fluorocarbon gas and an inert gas, the fluorocarbon-containing deposition layer being formed in direct contact with the silicon oxide of the target layer in the first region and in direct contact with the silicon nitride of the mask pattern in the second region, wherein, in the second region the silicon nitride of the mask pattern is interposed between the fluorocarbon-containing deposition layer and the target layer;
    providing a plasma of an inert gas to the deposition layer to activate an etching reaction of the silicon oxide under the fluorocarbon-containing deposition layer, wherein a negative direct current voltage is applied to an opposing part that includes silicon and is spaced apart from and faces the fluorocarbon-containing deposition layer so that a silicon ion or a secondary electron output from the opposing part is provided to the fluorocarbon-containing deposition layer with the plasma of the inert gas; and
    subsequently, providing a plasma of a second treatment gas to remove an etching reaction product, the second treatment gas including an inert gas and an oxygen-containing gas.

2. The method as claimed in claim 1, wherein the fluorocarbon gas includes one or more of $C_4F_8$, $CF_4$, or $C_4F_6$, and the fluorocarbon-containing deposition layer includes $SiC_xF_y$.

3. The method as claimed in claim 1, wherein the inert gas includes one or more of argon, helium, neon, krypton, or xenon.

4. The method as claimed in claim 1, wherein the oxygen-containing gas includes one or more of $O_2$, carbon dioxide, or carbon monoxide.

5. The method as claimed in claim 1, wherein the fluorocarbon gas includes $C_4F_6$, the inert gas includes argon, and the oxygen-containing gas includes $O_2$.

6. The method as claimed in claim 1, wherein the negative direct current voltage applied to the opposing part is $-100$ V to $-600$ V.

7. The method as claimed in claim 1, wherein:
    a silicon ion is released from the silicon of the opposing part to be provided to the fluorocarbon-containing deposition layer when the plasma of the inert gas is provided to activate the etching reaction of the silicon oxide, and
    the etch rate of the silicon nitride in the etching reaction is lower than the etch rate of the silicon oxide in the etching reaction.

* * * * *